(12) United States Patent
Pattantyus-Abraham et al.

(10) Patent No.: US 11,056,528 B2
(45) Date of Patent: Jul. 6, 2021

(54) IMAGE SENSOR WITH PHASE-SENSITIVE PIXELS

(71) Applicant: INVISAGE TECHNOLOGIES, INC., Newark, CA (US)

(72) Inventors: Andras Pattantyus-Abraham, Menlo Park, CA (US); Nikolai E. Bock, San Jose, CA (US); Emanuele Mandelli, Mountain View, CA (US)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 159 days.

(21) Appl. No.: 16/341,899

(22) PCT Filed: Oct. 23, 2017

(86) PCT No.: PCT/US2017/057781
§ 371 (c)(1),
(2) Date: Apr. 14, 2019

(87) PCT Pub. No.: WO2018/080946
PCT Pub. Date: May 3, 2018

(65) Prior Publication Data
US 2019/0252455 A1    Aug. 15, 2019

Related U.S. Application Data

(60) Provisional application No. 62/411,910, filed on Oct. 24, 2016.

(51) Int. Cl.
*H01L 27/146* (2006.01)
*H04N 5/374* (2011.01)

(52) U.S. Cl.
CPC .. *H01L 27/14665* (2013.01); *H01L 27/14612* (2013.01); *H01L 27/14614* (2013.01); *H04N 5/374* (2013.01)

(58) Field of Classification Search
CPC ......... H01L 27/14665; H01L 27/14614; G01S 17/894
See application file for complete search history.

(56) References Cited

U.S. PATENT DOCUMENTS

| 7,923,801 | B2 | 4/2011 | Tian et al. | |
|---|---|---|---|---|
| 2009/0152664 | A1* | 6/2009 | Klem | H01L 27/14641 257/440 |
| 2010/0201966 | A1* | 8/2010 | Mase | G01S 7/4863 356/5.01 |

FOREIGN PATENT DOCUMENTS

| EP | 2166373 A1 | 3/2010 |
|---|---|---|
| WO | 2015188146 A2 | 12/2015 |

OTHER PUBLICATIONS

International Application # PCT/US2017/057781 search report dated Feb. 19, 2018.
(Continued)

*Primary Examiner* — Thanh Luu
(74) *Attorney, Agent, or Firm* — Kligler & Associates Patent Attorneys Ltd

(57) ABSTRACT

Imaging apparatus (100, 200) includes a photosensitive medium (302) configured to convert incident photons into charge carriers. A bias electrode (304) overlies the photosensitive medium and applies a bias potential to the photosensitive medium. One or more pixel circuits (306) are formed on a semiconductor substrate. Each pixel circuit defines a respective pixel (300) and includes first and second pixel electrodes (316, 318) coupled to collect the charge carriers from the photosensitive medium at respective first and second locations, and first and second transfer gates (326, 328) in respective proximity to the first and second pixel electrodes. Circuitry (700) is coupled to apply different, respective first and second potentials to the first and second transfer gates and to vary the first and second
(Continued)

potentials so as to control relative proportions of the charge carriers that are collected by the first and second electrodes.

17 Claims, 7 Drawing Sheets

(56) References Cited

OTHER PUBLICATIONS

Kawahito et al., "A CMOS Time-of-Flight Range Image Sensor With Gates-on-Field-Oxide Structure", IEEE Sensors Journal, vol. 7, pp. 1578-1586, Dec. 12, 2007.

* cited by examiner

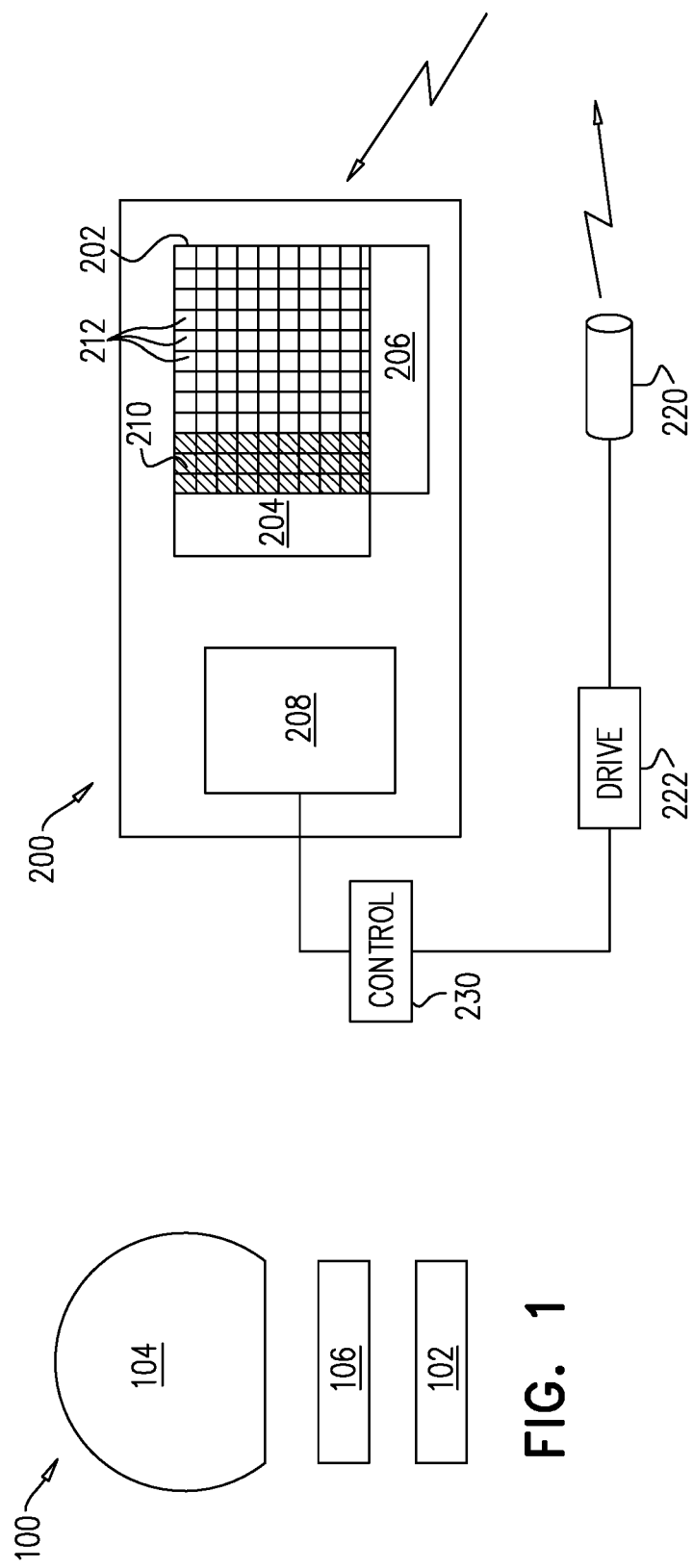

IMAGE SENSOR WITH PHASE-SENSITIVE PIXELS

CROSS-REFERENCE TO RELATED APPLICATION

This application claims the benefit of U.S. Provisional Patent Application 62/411,910, filed Oct. 24, 2016, which is incorporated herein by reference.

FIELD OF THE INVENTION

The present invention relates generally to image sensing devices, and particularly to film-based image sensors and methods for sensing using such image sensors.

BACKGROUND

In film-based image sensors, a silicon-based switching array is overlaid with a photosensitive film such as a film containing a dispersion of quantum dots. Films of this sort are referred to as "quantum films." The switching array, which can be similar to those used in complementary metal-oxide sandwich (CMOS) image sensors that are known in the art, is coupled by suitable electrodes to the film in order to read out the photocharge that accumulates in each pixel of the film due to incident light.

U.S. Pat. No. 7,923,801, whose disclosure is incorporated herein by reference, describes materials, systems and methods for optoelectronic devices based on such quantum films.

SUMMARY

Embodiments of the present invention that are described hereinbelow provide enhanced image sensor designs and methods for operation of image sensors with enhanced performance.

There is therefore provided, in accordance with an embodiment of the invention, imaging apparatus, including a photosensitive medium configured to convert incident photons into charge carriers. A bias electrode, which is at least partially transparent, overlies the photosensitive medium and configured to apply a bias potential to the photosensitive medium. One or more pixel circuits are formed on a semiconductor substrate. Each pixel circuit defines a respective pixel and includes first and second pixel electrodes coupled to collect the charge carriers from the photosensitive medium at respective first and second locations, which are spaced apart across the pixel, and first and second transfer gates in respective proximity to the first and second pixel electrodes. Circuitry is coupled to apply different, respective first and second potentials to the first and second transfer gates and to vary the first and second potentials so as to control relative proportions of the charge carriers that are collected by the first and second electrodes.

In some embodiments, the photosensitive medium includes a quantum film. In one embodiment, the quantum film has a first charge mobility, and the photosensitive medium includes a non-conductive layer having a second charge mobility, higher than the first charge mobility, between the quantum film and the first and second electrodes. Additionally or alternatively, the pixel circuit includes a photogate between the first and second transfer gates in proximity to the photosensitive medium, and the circuitry is configured to bias the photogate in order to facilitate transfer of the charge carriers to the first and second pixel electrodes.

In some embodiments, the pixel circuit includes readout circuitry, which is configured to output first and second signals responsively to the charge carriers collected respectively by the first and second pixel electrodes. In a disclosed embodiment, the apparatus also includes an illumination source, which is configured to output pulses of radiation having a specified pulse duration, and control circuitry, which is configured to drive the one or more pixel circuits in synchronization with the pulses of the radiation to sequentially apply first and second control pulses, having the specified pulse duration, to the first and second transfer gates, respectively, and to compare the first and second signals that are output in response to the first and second control pulses in order to estimate a time of flight of the radiation. In a typical application, the one or more pixel circuits define multiple pixels arranged in rows and columns of an array, and the control circuitry is configured to apply the estimated time of flight over the array in order to construct a depth map of an object irradiated by the illumination source.

There is also provided, in accordance with an embodiment of the invention, imaging apparatus, including an illumination source, which is configured to output modulated radiation, and an image sensor, including a photosensitive medium configured to convert incident photons into charge carriers and at least one bias electrode, which is at least partially transparent, overlying the photosensitive medium. An array of pixel circuits is formed on a semiconductor substrate. Each pixel circuit defines a respective pixel and including a pixel electrode coupled to collect the charge carriers from the photosensitive medium and readout circuitry configured to output a signal responsively to the charge carriers collected by the pixel electrode. Control circuitry is coupled to apply to the at least one bias electrode a potential that is modulated in synchronization with the modulated radiation and causes the voltage between the at least one bias electrode and the at least one pixel electrode to vary periodically between positive and negative values.

In some embodiments, the readout circuitry is configured, in each of a sequence of image frames, to generate the signal in response to the charge carriers accumulated by the at least one pixel electrode over one or more full periods of the modulated potential. In a disclosed embodiment, the control circuitry is configured to drive both the illumination source and the at least one bias electrode with an identical modulation pattern.

In one embodiment, the at least one bias electrode includes first and second bias electrodes, which overlie different, respective first and second areas of the photosensitive medium, wherein the control circuitry is configured to apply a modulation pattern with different, respective first and second phases, for example 180° apart, to the first and second bias electrodes, and wherein the pixel circuits include at least first and second pixel circuits, which are configured to collect the charge carriers from the first and second areas of the photosensitive medium. In a disclosed embodiment, the control circuitry is configured to compare the signals that are output by the first and second pixel circuits in order to estimate a time of flight of the radiation.

There is additionally provided, in accordance with an embodiment of the invention, a method for imaging, which includes overlaying a bias electrode, which is at least partially transparent, on a photosensitive medium configured to convert incident photons into charge carriers. One or more pixel circuits are coupled to the photosensitive medium. Each pixel circuit defines a respective pixel and includes first and second pixel electrodes configured to collect the charge carriers from the photosensitive medium at respective first and second locations, which are spaced apart across the pixel, and first and second transfer gates in respective proximity to the first and second pixel electrodes. Different, respective first and second potentials are applied to the first and second transfer gates and are varied so as to control relative proportions of the charge carriers that are collected by the first and second electrodes.

There is further provided, in accordance with an embodiment of the invention, a method for imaging, which includes driving an illumination source to output modulated radiation and sensing the radiation using an image sensor, which includes a photosensitive medium configured to convert incident photons into charge carriers, at least one bias electrode, which is at least partially transparent, overlying the photosensitive medium, and an array of pixel circuits, each pixel circuit defining a respective pixel, which are coupled to collect the charge carriers from the photosensitive medium and to output a signal responsively to the collected charge carriers. A potential that is modulated in synchronization with the modulated radiation is applied to the at least one bias electrode and causes the voltage between the at least one bias electrode and the at least one pixel electrode to vary periodically between positive and negative values.

The present invention will be more fully understood from the following detailed description of the embodiments thereof, taken together with the drawings in which:

BRIEF DESCRIPTION OF THE DRAWINGS

FIG. 1 is a schematic side view of a camera module, which is operative in accordance with an embodiment of the invention;

FIG. 2 is a schematic top view of an imaging system using active illumination, in accordance with an embodiment of the invention;

DETAILED DESCRIPTION OF EMBODIMENTS

System Overview

Figure 3:
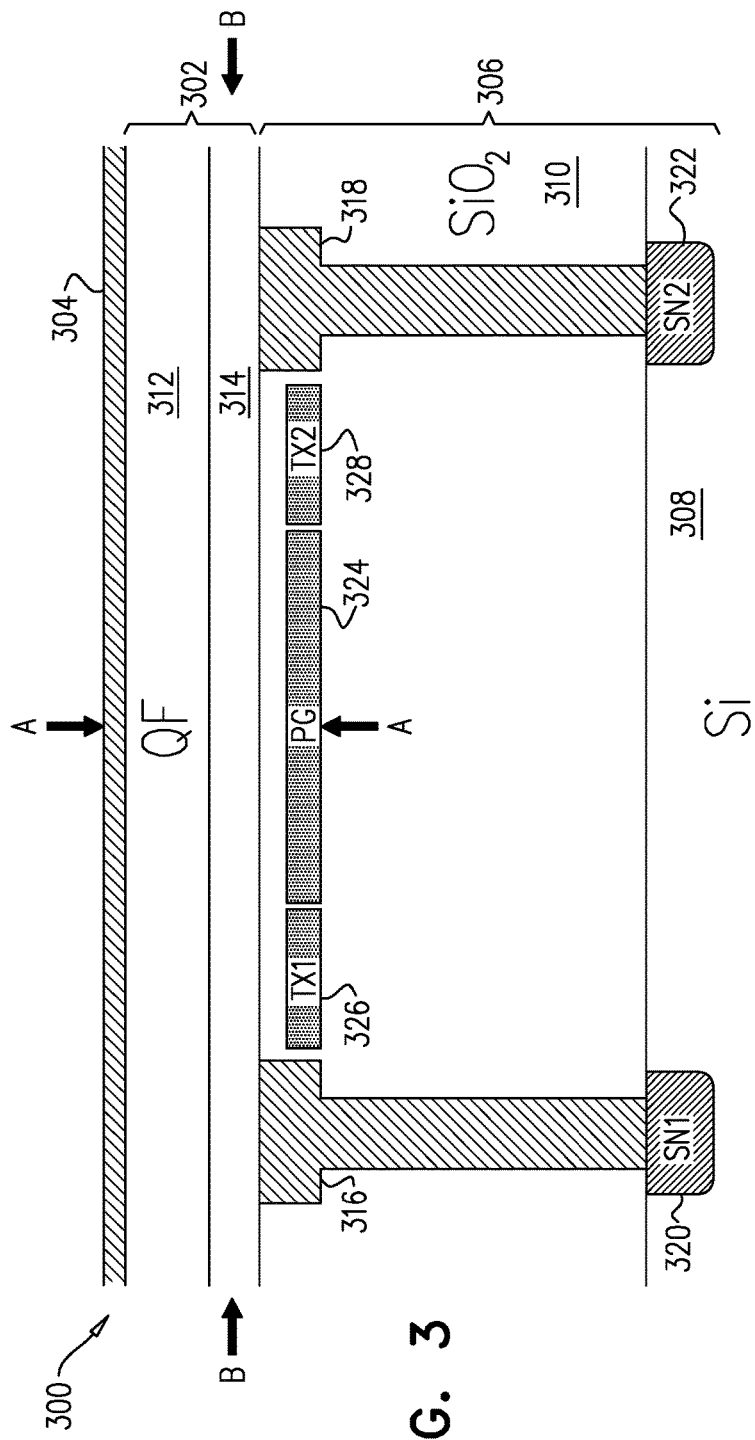
FIG. 3 is a schematic sectional view of a pixel with dual sense nodes, in accordance with an embodiment of the invention.

The image sensors described herein may be used within any suitable imaging device, such as a camera, spectrometer, light sensor, or the like. FIG. 1 shows one example of a camera module 100 that may utilize an image sensor 102, which may be configured in any manner as described below. The camera module 100 may comprise a lens system 104, which may direct and focus incoming light onto image sensor 102. While depicted in FIG. 1 as a single element, it should be appreciated that lens system 104 may actually include a plurality of lens elements, some or all of which may be fixed relative to each other (e.g., via a lens barrel or the like). Camera module 102 may optionally be configured to move lens system 104 and/or image sensor 102 to perform autofocus and/or optical image stabilization.

Camera module 100 may further comprise one or more optional filters, such as a filter 106, which may be placed along the optical path. Filter 106 may reflect or otherwise block certain wavelengths of light, and may substantially prevent, based on the effectiveness of the filter, these wavelengths of light from reaching image sensor 102. As an example, when an image sensor is configured to measure visible light, filter 106 may comprise an infrared cutoff filter. While shown in FIG. 1 as being positioned between image sensor 102 and lens system 104, filter 106 may be positioned to cover lens system 104 (relative to incoming light) or may be positioned between lenses of lens system 104.

FIG. 2 shows a top view of an exemplary image sensor 200, forming part of an imaging system as described herein. Image sensor 200 may comprise an imaging area comprising a pixel array 202, which may include pixels 212 arranged in rows and columns and comprise a photosensitive medium, such as a quantum film, as shown in the figures that follow, which may be used to convert incident light into electrical signals. Each pixel 212 is defined by a corresponding pixel circuit (also referred to as pixel circuitry), formed on a semiconductor substrate, as described further hereinbelow. In some instances, pixel array 202 may comprise an obscured region 210 including at least one pixel (e.g., a second plurality of pixels) that is obscured relative to incoming light (e.g., covered by a light-blocking layer). Electrical signals may still be read out from some or all of these pixels, but since there is ideally no light reaching these pixels, the current measured from these pixels may represent the dark current associated with one or more components of the image sensor. Image sensor 200 (or associated processing circuitry) may compensate for the dark current levels during image capture and/or processing.

Image sensor 200 may further comprise row circuitry 204 and column circuitry 206, which collectively may be used to convey various signals (e.g., bias voltages, reset signals) to individual pixels as well as to read out signals from individual pixels. For example, row circuitry 204 may be configured to simultaneously control multiple pixels in a given row, while column circuitry 206 may convey pixel electrical signals to other circuitry for processing. Accordingly, image sensor 200 may comprise control circuitry 208, which may control the row circuitry 204 and column circuitry 206, as well as performing input/output operations (e.g., parallel or serial IO operations) for image sensor 200.

In particular, in the embodiments that are described hereinbelow, control circuitry 208 reads out the signals from the pixel circuits in pixels 212 in each of a periodic sequence of readout frames, while driving array 202 with particular drive and bias signals. The control circuitry may include a combination of analog circuits (e.g., circuits to provide bias and reference levels) and digital circuits (e.g., image enhancement circuitry, line buffers to temporarily store lines of pixel values, register banks that control global device operation and/or frame format).

In some embodiments, as shown in FIG. 2, image sensor 200 operates in conjunction with an illumination source 220, such as a suitable LED or laser, which is driven by drive circuitry 222 to output modulated radiation, such as a sequence of pulses. In some embodiments, referred to herein as active illumination schemes, illumination source 220 outputs the modulated radiation toward a target, and image sensor 200 detects the modulated radiation that is reflected from the target. Illumination source 220 may emit radiation in any suitable wavelength band to which image sensor 200 is sensitive, for example in visible, infrared and/or ultraviolet bands. Assuming image sensor 200 to comprise a quantum film, near-infrared wavelengths, for example around 940 nm, can conveniently be used and detected by the image sensor with high quantum efficiency. A control unit 230 applies suitable control signals to both drive circuitry 222 and image sensor 200 in order to synchronize certain detection functions of the image sensor with the modulation of the illumination output by illumination source 220. A number of such modulation scenarios are described below.

Additionally or alternatively, control unit 230 may be configured to perform higher-level image processing functions on the image data output by pixel array 202. For this purpose, in some embodiments, control unit 230 comprises a programmable processor, such as a microprocessor or digital signal processor, which can be programmed in software to perform image processing functions. For example, such a processor can be programmed to estimate the time of flight of radiation emitted by illumination source 220 and sensed by image sensor 200, as described hereinbelow. Furthermore, the processor can apply the estimated times of flight over array 202 in order to construct a depth map of an object irradiated by the illumination source, wherein the time of flight measured by each pixel of the image sensor indicates the distance to a corresponding point on the object begin mapped. Alternatively, such processing functions can be performed by a separate computer or other image processor (not shown in the figures), which receives image data from image sensor 200.

Although control unit 230 and control circuitry 208 are shown in FIG. 2, for the sake of conceptual clarity, as separate functional blocks, in practice these functional components may be combined in a single chip or chip set. Therefore, references to control circuitry in the description that follows and in the claims should be understood as referring collectively to control circuitry 208 and control unit 230, unless stated otherwise.

Differential Time of Flight Detection

FIG. 3 is a schematic sectional view of a pixel 300 with dual sense nodes 320, 322, in accordance with an embodiment of the invention. Typically, pixel 300 is one of an array of pixels of this sort, such as pixels 212 in array 202, but the principles of this embodiment may alternatively be applied in a single-pixel detector.

Pixel 300 comprises a photosensitive medium 302, which converts incident photons into charge carriers (electrons and holes). In the pictured example, photosensitive medium 302 comprises a quantum film 312, as defined above, with an underlying non-conductive layer 314. Typically, quantum film 312 has low charge mobility, and layer 314 (comprising silicon or ZnO, for example) has a high charge mobility to facilitate collection of the charge carriers generated in quantum film 312.

A bias electrode 304, which is at least partially transparent, overlies photosensitive medium 302 and is driven by control circuitry 208 to apply a bias potential to the photosensitive medium. A pixel circuit 306, formed on a semiconductor substrate 308, such as a silicon wafer, collects charge carriers from a corresponding pixel of the photosensitive medium. Pixel circuit 306 comprises a pair of pixel electrodes 316 and 318, which collect the charge carriers from photosensitive medium 302 at respective locations that are spaced apart on opposite sides of the pixel. Electrodes 316 and 318 typically extend through an insulating layer 310, such as one or more layers of $SiO_2$, to respective sense nodes 320 and 322, which can be formed on substrate 308 by floating diffusion, for example.

In order to control collection of charge carriers by pixel electrodes 316 and 318, pixel circuit 306 also includes transfer gates 326 and 328 (labeled TX1 and TX2) in respective proximity to the pixel electrodes. As explained in detail with reference to the figures that follow, pixel circuit 306 applies different, respective potentials to transfer gates 326 and 328, and varies these potentials in order to control the relative proportions of the charge carriers that are collected by the two pixel electrodes and stored at sense nodes 320 and 322. A photogate 324 in proximity to photosensitive medium 312, between transfer gates 326 and 328, is biased in order to facilitate transfer of the charge carriers to the pixel electrodes. The bias on photogate 324, relative to bias electrode 304, creates a potential well for collecting the photocharge and applies a sufficient electric field across quantum film 312 to maximize the quantum efficiency.

Figure 4:
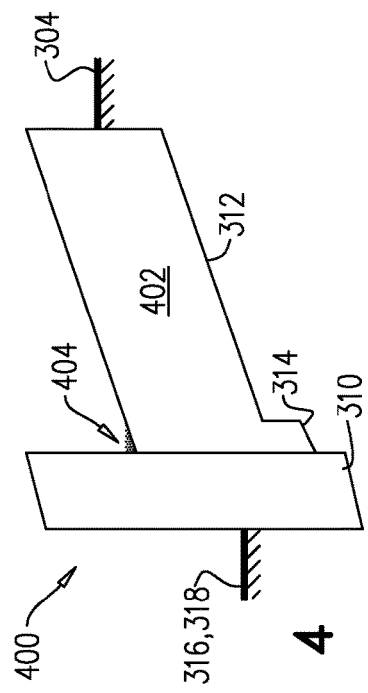
FIG. 4 is an electrical band diagram that schematically shows a potential distribution along the line A-A in FIG. 3, in accordance with an embodiment of the invention.

FIG. 4 is an electrical band diagram that schematically shows a potential distribution 400 along the line A-A in FIG. 3, illustrating the principles of operation of pixel 300 in accordance with an embodiment of the invention. In this example, pixel 300 is configured for electron collection, but the same principles can be applied, mutatis mutandis, to collection of holes. Mobile electrons 404 are collected in a conduction band, over a potential band 402 of photosensitive material 302, at the interface between photosensitive medium 302 and insulating layer 310. High-mobility layer 314 facilitates storage and fast transfer of the collected photocharge, while creating a potential barrier for holes to avoid unwanted recombination.

Figure 5:
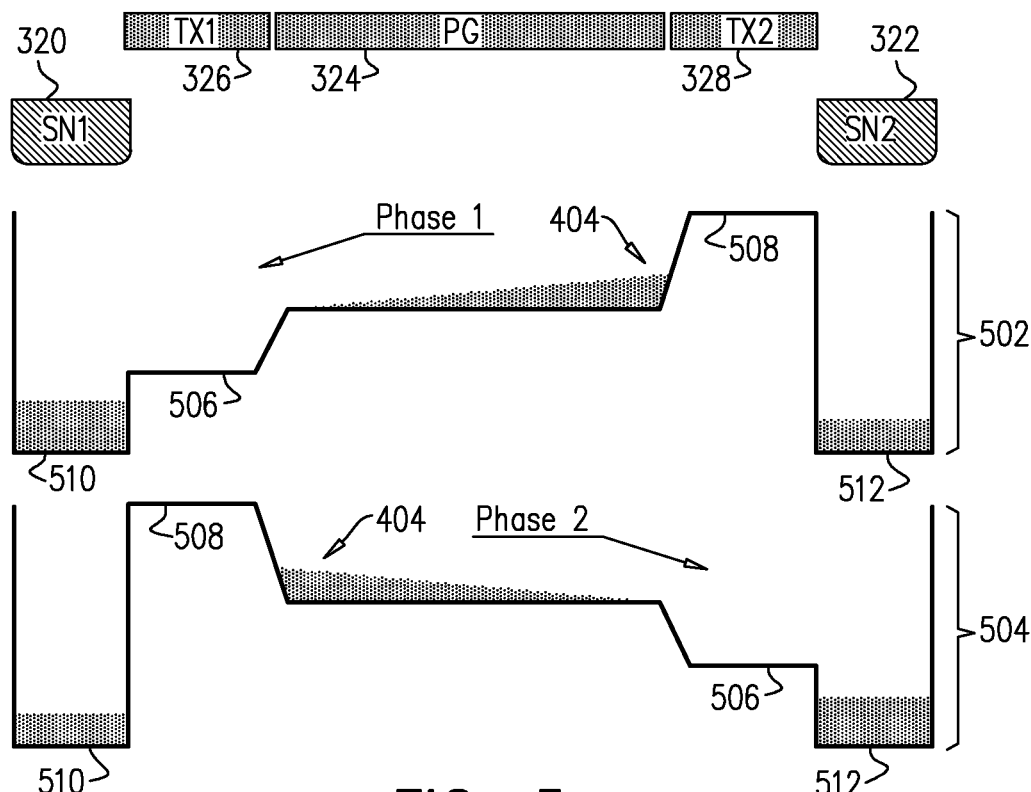
FIG. 5 is a plot that schematically shows potential distributions along the line B-B in FIG. 3 during two phases of operation, in accordance with an embodiment of the invention.

FIG. 5 is a plot that schematically shows potential distributions along the line B-B in FIG. 3 during two phases 502 and 504 of the operation of pixel 300, in accordance with an embodiment of the invention. During phase 502 (labeled Phase 1), gate 326 is biased at a high level 506, while gate 328 is biased at a low level 508. Therefore, charge collected across photogate 324 will flow to sense node 320 (SN1), thus creating a high charge level 510, relative to a lower charge level 512 collected in this phase at sense node 322 (SN2). During phase 504, the bias levels are reversed, with gate 328 biased high and gate 326 biased low, so that the collected charge flows in greater relative proportion to sense node 322.

Figure 6:
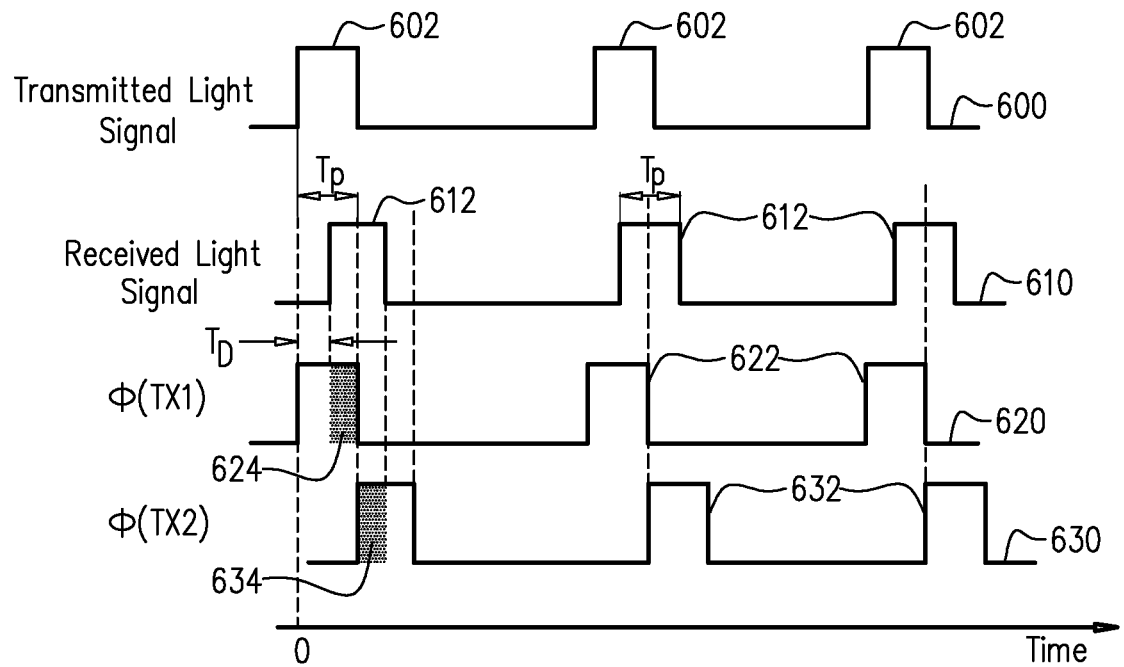
FIG. 6 is a timing diagram that schematically shows signals applied to and received in a time-of-flight imaging system, in accordance with an embodiment of the invention.

FIG. 6 is a timing diagram that schematically shows signals applied to and received in a time-of-flight imaging system based on the principles explained above, in accordance with an embodiment of the invention. This diagram illustrates the use of pixel 300 in a system of the sort that is shown in FIG. 2. Illumination source 220 outputs a sequence 600 of pulses 602 of radiation, having a specified pulse duration $T_P$. The pulses are reflected from a target in a scene and return to image sensor 200 with a delay $T_D$, as illustrated by a sequence 610 of received pulses 612. The delay $T_D$ depends on the time of flight of the pulses to and from the target, which is a function of the distance of the target from the illumination source and image sensor.

Control unit 230 drives pixel circuit 306 in synchronization with pulses 602, as illustrated by traces 620 and 630, which comprise control pulses 622 and 632 that are applied to transfer gates 326 and 328, respectively. Pulses 622 are applied during phase 502, and trace 620 is therefore labeled $\phi(TX1)$; while pulses 632 are applied during phase 504, and trace 630 is labeled $\phi(TX2)$. Pulses 622 and 632 have the same duration $T_P$ as pulses 602. Pulses 622 are in phase with pulses 602, whereas pulses 632 are delayed by a time equal to the pulse duration $T_P$. The amounts of photocharge that will be collected at sense nodes 320 and 322 depend on the respective overlaps 624 and 634 between each of pulses 622 and 632 and received pulse 612, which in turn depend on the delay $T_D$. Control unit 230 can thus estimate the time of flight of the radiation based on the signals that are output respectively from sense nodes 320 and 322.

The estimation of the time of flight can be carried out as follows: The amount of charge Q1 transferred into sense node 320 is given by:

$$Q1 = I_{PH} * (T_P - T_D), \quad (1)$$

wherein $I_{PH}$ is the photocurrent due to the reflected illumination pulse. The amount of charge Q2 transferred into sense node 322 is given by:

$$Q2 = I_{PH} * T_D. \quad (2)$$

$T_D$ can be found from equations (1) and (2):

$$T_D = T_P * Q2 / (Q1 + Q2) \quad (3)$$

The distance L to the target from which pulses 612 are reflected is then given by:

$$L = c * T_D * Q2 / (2 * (Q1 + Q2)), \quad (4)$$

wherein c is the speed of light. Control unit 230 can assemble these distance measurements over an entire array of pixels 300 in order to construct a depth map of a scene that is illuminated by illumination source 220 and imaged onto image sensor 200.

For lower distances and higher resolution, shorter illumination pulses give better results. For example, a pulse width of 10 ns is useful for a maximum range of about 1 m. The signals from pixels 300 can be integrated over multiple, sequential pulses for improved accuracy, as long as the objects in the scene are not moving. The maximum range is given by:

$$L_{max} = c * T_P / 2 \quad (5)$$

The depth resolution depends on the illumination pulse duration and collected charge. Ignoring noise and possible offset or background charge, the range resolution is given by:

$$\sigma_L = c * T_P / (4 * (N_1 + N_2)^{1/2}), \quad (6)$$

wherein $N_1$ is the number of electrons collected at sense node 320, and $N_2$ is the number of electrons collected at sense node 322.

Figure 7:
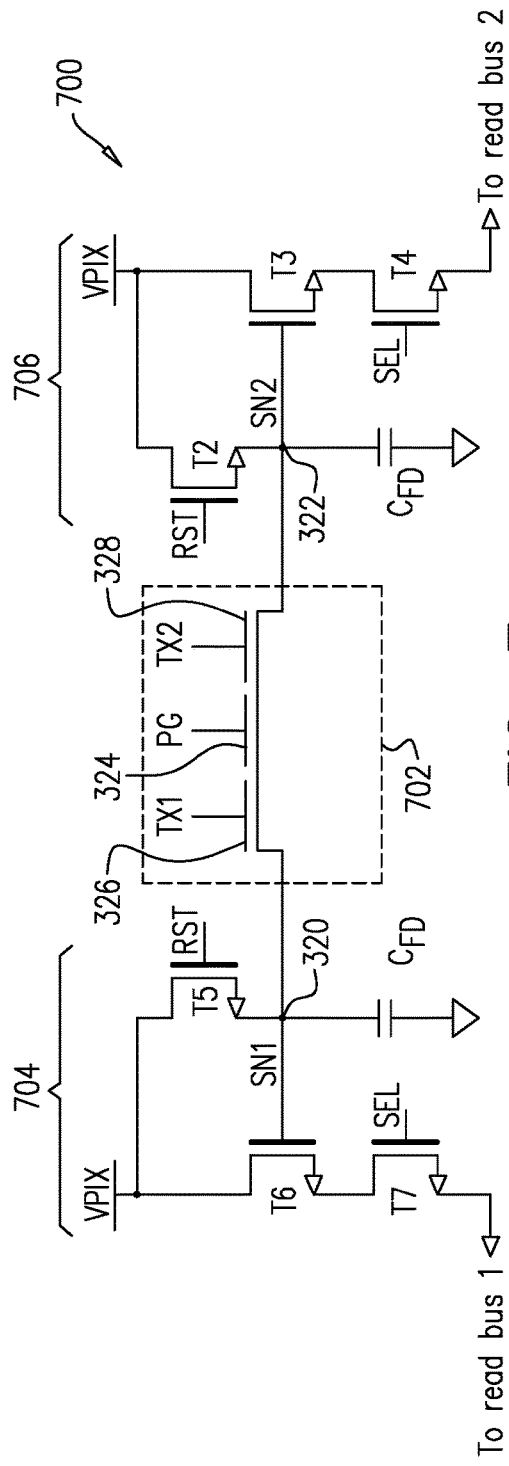
FIG. 7 is an electrical schematic diagram showing a pixel control and readout circuit, in accordance with an embodiment of the invention.

FIG. 7 is an electrical schematic diagram showing a pixel control and readout circuit 700, in accordance with an embodiment of the invention. Circuit 700 is a part of pixel circuit 306 and outputs signals to the read buses of the image sensor in responsive to the charge carriers collected at sense nodes 320 and 322 via the respective pixel electrodes 316 and 318. As shown in FIG. 7, circuit 700 comprises a three-gate charge coupling circuit 702, comprising photogate 324 and transfer gates 326 and 328, along with readout circuits 704 and 706, which couple sense nodes 320 and 322 to read buses 1 and 2, respectively. Readout circuits 706 and 704 respectively comprise reset transistors T2 and T5, source-follower transistors T3 and T6, and select transistors T4 and T7.

Figure 8:
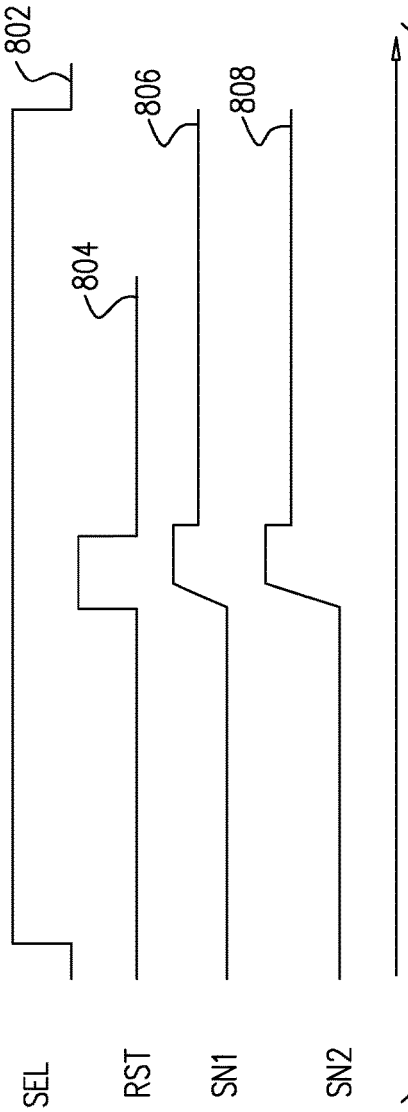
FIG. 8 is a timing diagram that schematically shows signals applied to and received in the circuit of FIG. 7, in accordance with an embodiment of the invention.

FIG. 8 is a timing diagram that schematically shows signals applied to and received in readout circuits 704 and 706, in accordance with an embodiment of the invention. The pixel readout starts when both charge integration phases 502 and 504 have been completed, and sense nodes 320 and 322 have accordingly accumulated respective charge levels, as illustrated by traces 806 and 808. Readout starts when the select (SEL) signal goes high, as illustrated by a trace 802. The pixel source followers T3 and T6 are thus connected to the respective read buses. The output signals to the buses will be proportional to the charge accumulated in the respective sense nodes 320 and 322. A reset (RST) signal, shown as a trace 804, turns on the reset transistors T2 and T5. The potential at sense nodes 320 and 322 is now reset to VPIX, and the reset voltage is measured on the read buses.

Image Sensor with Bias Modulation

Figure 9:
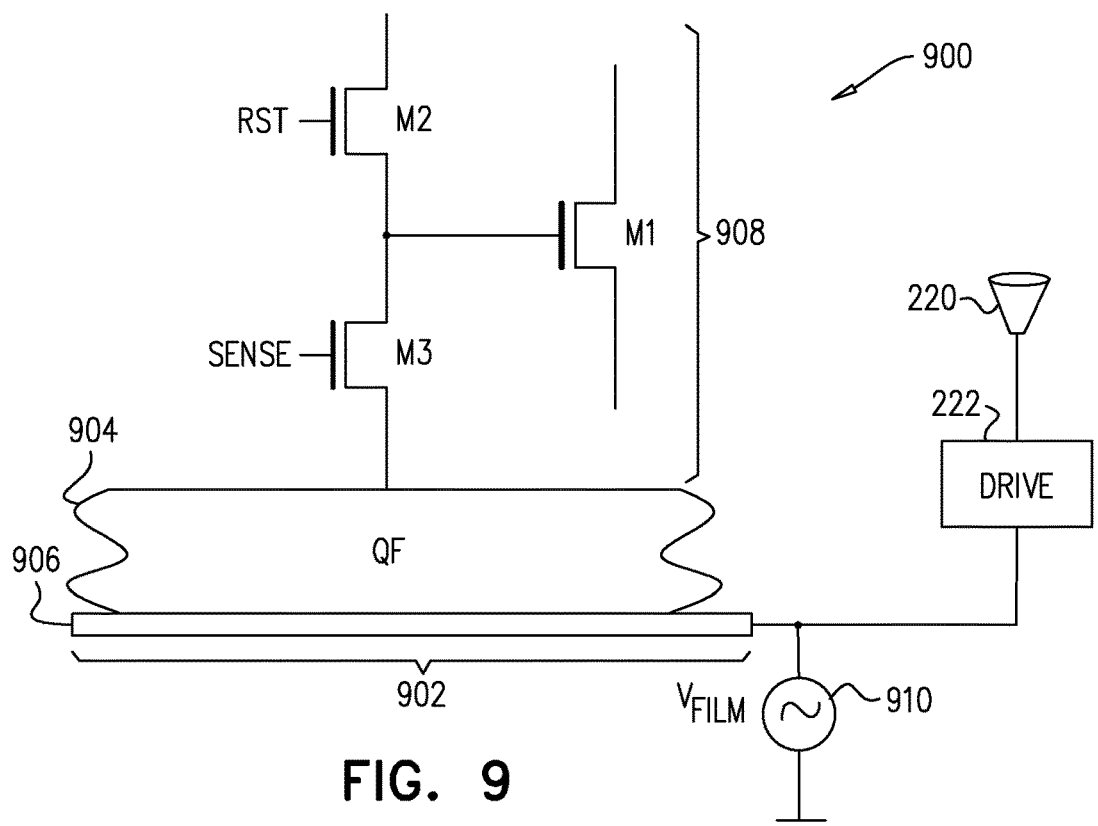
FIG. 9 is an electrical schematic diagram showing elements of an imaging system using active illumination, in accordance with another embodiment of the invention.

FIG. 9 is an electrical schematic diagram showing elements of an imaging system 900 using active illumination by illumination source 220, in accordance with another embodiment of the invention. This embodiment and the figures that follow present an alternative implementation of pixels 212 in image sensor 200, which is useful particularly in reducing the vulnerability of the imaging system to ambient lighting, i.e., illumination originating from sources other than illumination source 220. As in the preceding embodiment, FIG. 9 shows a single pixel of the imaging array, which is typically reproduced over multiple rows and columns.

In system 900, each pixel 902 of the image sensor, comprises a photosensitive medium 904, such as a quantum film, which converts incident photons into charge carriers. A bias electrode 906, which is at least partially transparent, overlies the photosensitive medium. An array of pixel circuits 908 is formed on a semiconductor substrate, such as a silicon wafer. As in the preceding embodiment, each pixel circuit defines a respective pixel of the sensing array and comprises a pixel electrode (omitted from this figure for simplicity) coupled to collect the charge carriers from photosensitive medium 904. Readout circuitry in pixel circuit 908, comprising in this example transistors M1, M2 and M3, outputs a signal in response to the charge carriers collected by the pixel electrode.

Control circuitry, such as control unit 230 (FIG. 2), applies a potential to bias electrode 906 that is modulated in synchronization with the radiation emitted by illumination source 220. In the pictured example, this modulation function is implemented by a signal generator 910, which outputs the same, identical modulation pattern to both drive circuitry 222 of illumination source 220 and bias electrode 906. The modulation pattern, marked "$V_{FILM}$," may comprise any suitable sort of periodic signal with a zero mean, such as a sinusoid, square wave, or sawtooth, for example. The modulation causes illumination source 220 to emit pulses at the frequency of modulation, in synchronization with either the positive or negative phase of the modulation signal, and causes the voltage between bias electrode 906 and the pixel electrode to vary periodically between positive and negative values.

In each image frame captured by the image sensor, pixel circuit 908 integrates charge and generates an output signal based on the charge carriers accumulated by the pixel electrode over an integer number (one or more) full periods of the modulated potential across photosensitive medium 904. During the positive phase of the modulation, pixel circuit 908 accumulates electrons, whereas during the negative phase, the pixel circuit accumulates holes. Assuming the photo-response of medium 904 to be symmetrical, or at least monotonic, around zero, and pixel circuit 908 to integrate charge over an integer number of periods, the net charge accumulation at the pixel electrode under constant irradiation will be approximately zero. In other words, ambient radiation that is incident on photosensitive medium 904 will cause roughly equal numbers of electrons and holes to be collected during the respective phases, resulting in a net cancellation of the photocharge.

On the other hand, because the illumination pulses emitted by illumination source 220 are synchronized with one of the signal phases, reflected illumination pulses that are received by pixel 902 will cause only electrons or only holes to be accumulated, depending on the phase with which the illumination pulses are synchronized. In contrast to the preceding embodiment, it is desirable in this case that the frequency of the modulation pattern be low enough so that the phase shift between the emitted pulses and their reflections received by pixel 902 is small. Consequently, the signal output by pixel circuit 908 will indicate the intensity of the reflected pulses from illumination source 220 that are received by pixel 902, while the effect of ambient radiation is inherently suppressed.

Figure 10:
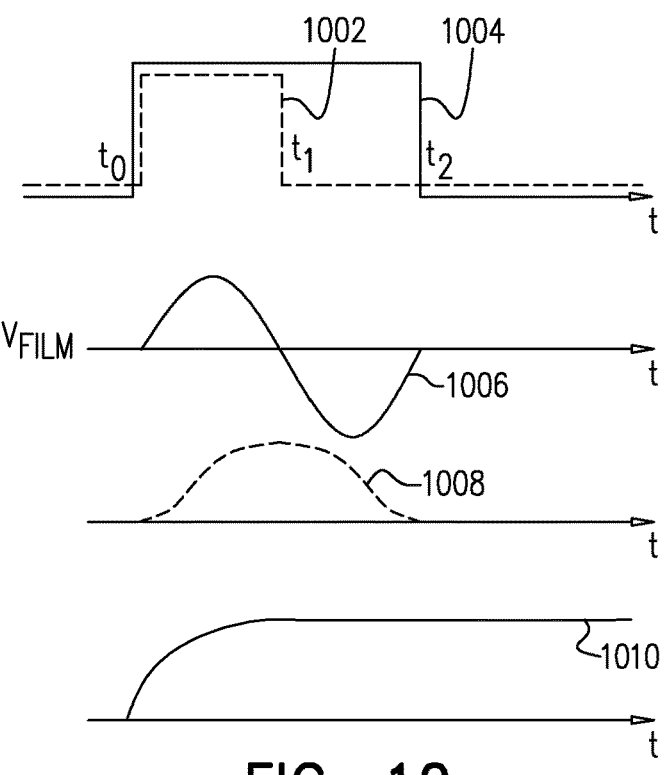
FIG. 10 is a plot that schematically shows waveforms applied and generated in the system of FIG. 9, in accordance with an embodiment of the invention.

FIG. 10 is a plot that schematically shows waveforms applied and generated in system 900, in accordance with an embodiment of the invention. An illumination pulse is represented by a trace 1002, while a corresponding integration period of pixel 902 is shown by a trace 1004. Photosensitive material 904 is unbiased and thus does not integrate any charge until the start of integration, at time $t_0$, and illumination source 220 meanwhile is off. At $t_0$ the modulation starts, as shown by a trace 1006, for both the bias of the photosensitive material and the illumination source. Between $t_0$ and $t_1$ pixel 902 integrates electrons, for example, and illumination source 220 is ON. Between $t_1$ and $t_2$ pixel 902 integrates holes, while illumination source 220 is OFF. The photocharge that accumulates due to ambient illumination is illustrated by a trace 1008, which integrates to zero. The photocharge accumulated due to the illumination pulse, on the other hand, is shown by a trace 1010. At the end of time $t_2$, the charge that is left on the sense node of pixel 902 is that due to the active illumination. All (or nearly all) background light is rejected, as the number of background integrated electrons equals the number of background integrated holes.

Figure 11:
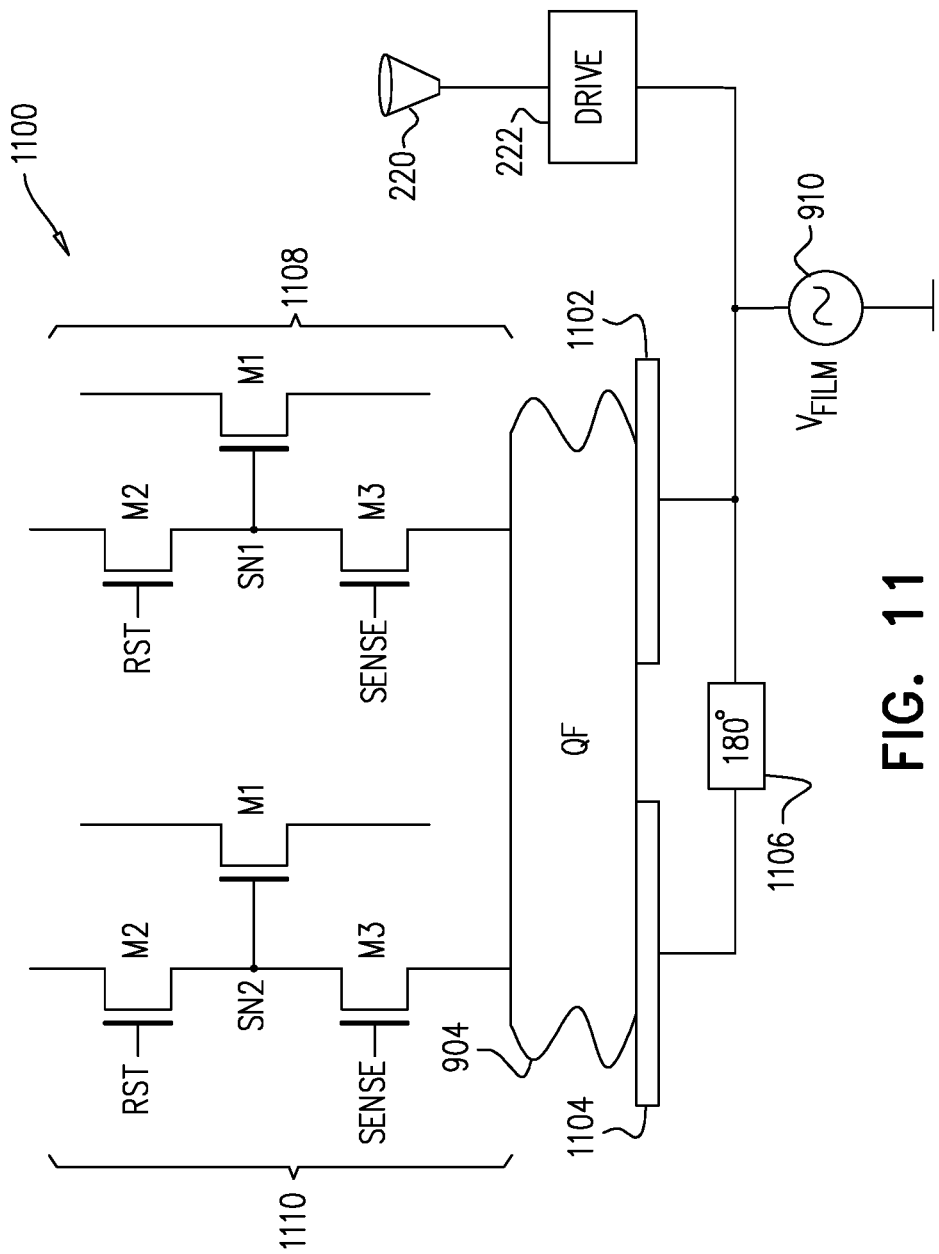
FIG. 11 is an electrical schematic diagram showing elements of an imaging system using active illumination, in accordance with yet another embodiment of the invention.

FIG. 11 is an electrical schematic diagram showing elements of an imaging system 1100 using active illumination, in accordance with yet another embodiment of the invention. In this case, the frequency of modulation provided by signal generator 910 is high enough so that there is a significant phase shift between the radiation pulses emitted by illumination source 220 and the reflected pulses received by photosensitive medium 904. The difference between the signals output by pixel circuits 1108 and 1110 can thus give an indication of the time of flight of the radiation pulses, while at the same time rejecting the ambient light background as in the preceding embodiment.

In system 1100, two or more different bias electrodes 1102 and 1104 overlie different, respective areas of photosensitive medium 904. Control unit 230, as embodied in signal generator 910, applies a modulation pattern with different, respective phases to the bias electrodes. In the pictured example, an inverter 1106 sets the phases of the biases applied to electrodes '1102 and 1104 to be 180° apart. Alternatively, phase delays of finer resolution may be applied over a set of two or more bias electrodes.

Pixel circuits 1108 and 1110 respectively collect the charge carriers from the different areas of photosensitive medium 904 that are biased by electrodes 1102 and 1104, respectively. The signals output by circuits 1108 and 1110 will then reflect the degree of overlap in time between the illumination pulses and the delayed, reflected pulses that are incident on the photosensitive medium, in a manner similar to that shown and described in reference to the embodiment of FIG. 3. Control unit 230 can thus compare the signals that are output by pixel circuits 1108 and 1110 in order to estimate the time of flight of the radiation pulses.

Figure 12:
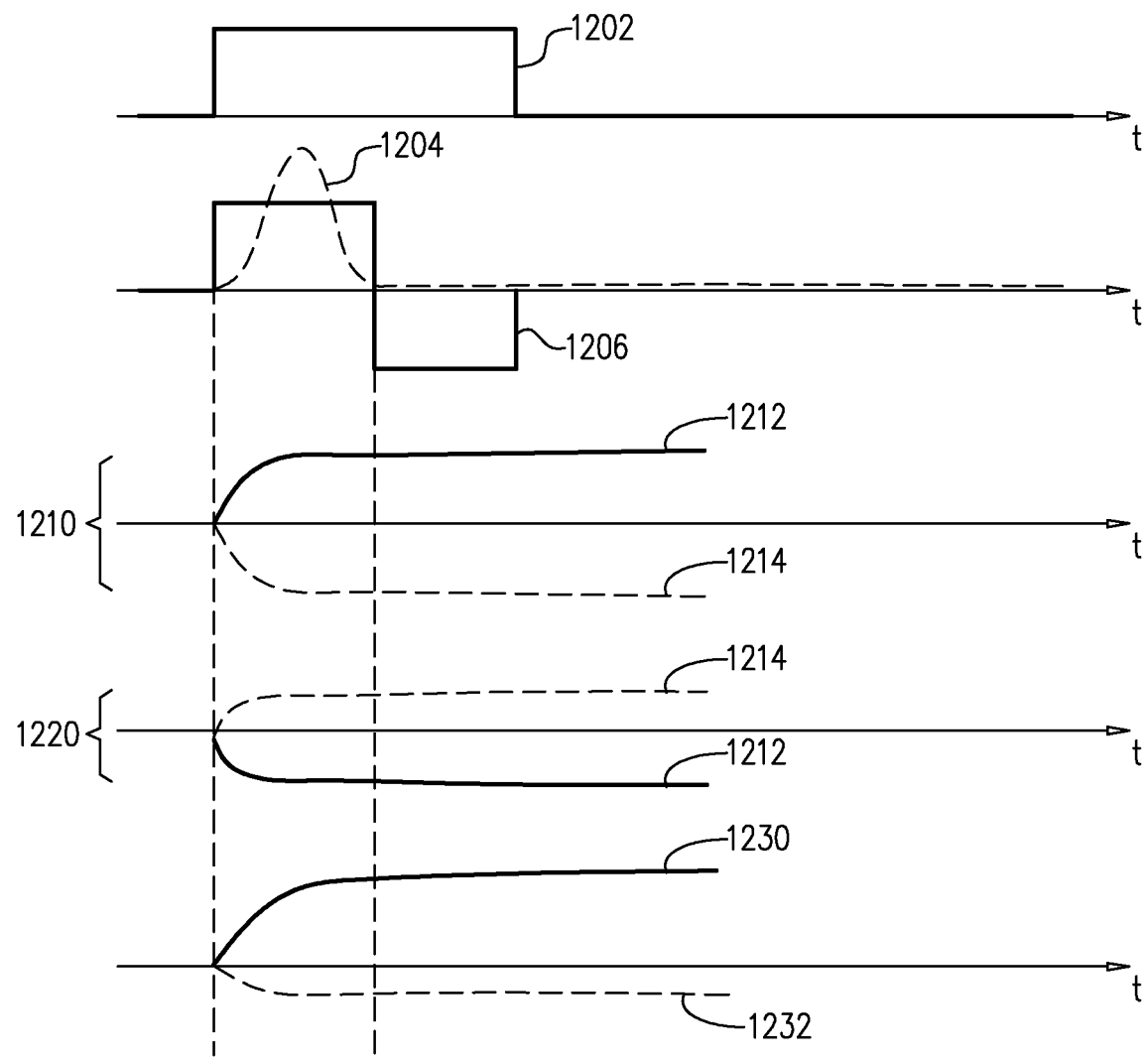
FIG. 12 is a plot that schematically shows waveforms applied and generated in the system of FIG. 11, in accordance with an embodiment of the invention.

FIG. 12 is a plot that schematically shows waveforms applied and generated for this purpose in system 1100, in accordance with an embodiment of the invention. The integration period of pixel circuits 1108 and 1110 is shown by a trace 1202. During the first half of this period, illumination source 220 emits a pulse 1204. The positive phase of the bias on electrode 1102 is synchronized with pulse 1204, as shown by a trace 1206. The phases of the bias on electrode 1104 are reversed relative to this trace.

In response to the accumulated charge during the integration period, pixel circuits 1108 and 1110 output signals that are represented by respective traces 1212 and 1214. A first pair 1210 of these traces shows the signals output in response to a nearby object, for which the reflected pulse will be largely in phase with the positive phase of trace 1206. A second pair 1220 of the traces shows the opposite case of a distant object, for which the phases are reversed. Control unit 230 estimates the object distance by taking differences between traces 1212 and 1214. For the near object, the difference is positive, as shown by a trace 1230, whereas for the distant object, the difference is negative, as shown by a second trace 1232.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:
1. Imaging apparatus, comprising:
a photosensitive medium, comprising a quantum film, which has a first charge mobility and is configured to convert incident photons into charge carriers;
a non-conductive layer having a second charge mobility, higher than the first charge mobility;

a bias electrode, which is at least partially transparent, overlying the photosensitive medium and configured to apply a bias potential to the photosensitive medium; and one or more pixel circuits formed on a semiconductor substrate, each pixel circuit defining a respective pixel and comprising:

first and second pixel electrodes coupled to collect the charge carriers from the photosensitive medium at respective first and second locations, which are spaced apart across the pixel, wherein the non-conductive layer is disposed between the quantum film and the first and second pixel electrodes;

first and second transfer gates in respective proximity to the first and second pixel electrodes; and circuitry coupled to apply different, respective first and second potentials to the first and second transfer gates and to vary the first and second potentials so as to control relative proportions of the charge carriers that are collected by the first and second electrodes.

2. The apparatus according to claim 1, wherein the pixel circuit comprises a photogate between the first and second transfer gates in proximity to the photosensitive medium, and wherein the circuitry is configured to bias the photogate in order to facilitate transfer of the charge carriers to the first and second pixel electrodes.

3. The apparatus according to claim 1, wherein the pixel circuit comprises readout circuitry, which is configured to output first and second signals responsively to the charge carriers collected respectively by the first and second pixel electrodes.

4. The apparatus according to claim 3, and comprising:

an illumination source, which is configured to output pulses of radiation having a specified pulse duration; and control circuitry, which is configured to drive the one or more pixel circuits in synchronization with the pulses of the radiation to sequentially apply first and second control pulses, having the specified pulse duration, to the first and second transfer gates, respectively, and to compare the first and second signals that are output in response to the first and second control pulses in order to estimate a time of flight of the radiation.

5. The apparatus according to claim 4, wherein the one or more pixel circuits define multiple pixels arranged in rows and columns of an array, and wherein the control circuitry is configured to apply the estimated time of flight over the array in order to construct a depth map of an object irradiated by the illumination source.

6. Imaging apparatus, comprising:

an illumination source, which is configured to output modulated radiation; and an image sensor, comprising:

a photosensitive medium configured to convert incident photons into charge carriers;

at least one bias electrode, which is at least partially transparent, overlying the photosensitive medium; and an array of pixel circuits formed on a semiconductor substrate, each pixel circuit defining a respective pixel and comprising a pixel electrode coupled to collect the charge carriers from the photosensitive medium and readout circuitry configured to output a signal responsively to the charge carriers collected by the pixel electrode; and control circuitry, which is coupled to apply to the at least one bias electrode a potential that is modulated in synchronization with the modulated radiation and causes the voltage between the at least one bias electrode and the at least one pixel electrode to vary periodically between positive and negative values.

7. The apparatus according to claim 6, wherein the readout circuitry is configured, in each of a sequence of image frames, to generate the signal in response to the charge carriers accumulated by the at least one pixel electrode over one or more full periods of the modulated potential.

8. The apparatus according to claim 6, wherein the photosensitive medium comprises a quantum film.

9. The apparatus according to claim 6, wherein the control circuitry is configured to drive both the illumination source and the at least one bias electrode with an identical modulation pattern.

10. The apparatus according to claim 6, wherein the at least one bias electrode comprises first and second bias electrodes, which overlie different, respective first and second areas of the photosensitive medium, wherein the control circuitry is configured to apply a modulation pattern with different, respective first and second phases to the first and second bias electrodes, and wherein the pixel circuits comprise at least first and second pixel circuits, which are configured to collect the charge carriers from the first and second areas of the photosensitive medium.

11. The apparatus according to claim 10, wherein the first and second phases are 180° apart.

12. The apparatus according to claim 10, wherein the control circuitry is configured to compare the signals that are output by the first and second pixel circuits in order to estimate a time of flight of the radiation.

13. A method for imaging, comprising:

overlaying a bias electrode, which is at least partially transparent, on a photosensitive medium configured to convert incident photons into charge carriers, wherein the photosensitive medium comprises a quantum film, which has a first charge mobility;

coupling one or more pixel circuits to the photosensitive medium, each pixel circuit defining a respective pixel and comprising first and second pixel electrodes configured to collect the charge carriers from the photosensitive medium at respective first and second locations, which are spaced apart across the pixel, and first and second transfer gates in respective proximity to the first and second pixel electrodes;

disposing a non-conductive layer, having a second charge mobility, higher than the first charge mobility, between the quantum film and the first and second pixel electrodes; and applying different, respective first and second potentials to the first and second transfer gates and varying the first and second potentials so as to control relative proportions of the charge carriers that are collected by the first and second electrodes.

14. The method according to claim 13, and comprising outputting first and second signals responsively to the charge carriers collected respectively by the first and second pixel electrodes.

15. The method according to claim 14, and comprising directing pulses of radiation having a specified pulse duration toward a target, wherein applying the different, respective first and second potentials comprises driving the one or more pixel circuits in synchronization with the pulses of the radiation to sequentially apply first and second control pulses, having the specified pulse duration, to the first and second transfer gates, respectively, and wherein the method comprises comparing the first and second signals that are output in response to the first and second control pulses in order to estimate a time of flight of the radiation.

16. The method according to claim 15, wherein the one or more pixel circuits define multiple pixels arranged in rows and columns of an array, and wherein the method comprises applying the estimated time of flight over the array in order to construct a depth map of an object irradiated by the illumination source.

17. A method for imaging, comprising:

driving an illumination source to output modulated radiation;

sensing the radiation using an image sensor, which comprises a photosensitive medium configured to convert incident photons into charge carriers, at least one bias electrode, which is at least partially transparent, overlying the photosensitive medium, and an array of pixel circuits, each pixel circuit defining a respective pixel, which are coupled to collect the charge carriers from the photosensitive medium and to output a signal responsively to the collected charge carriers; and applying to the at least one bias electrode a potential that is modulated in synchronization with the modulated radiation and causes the voltage between the at least one bias electrode and the at least one pixel electrode to vary periodically between positive and negative values.

* * * * *